United States Patent [19]
Hause et al.

[11] Patent Number: 5,861,335
[45] Date of Patent: Jan. 19, 1999

[54] SEMICONDUCTOR FABRICATION EMPLOYING A POST-IMPLANT ANNEAL WITHIN A LOW TEMPERATURE HIGH PRESSURE NITROGEN AMBIENT TO IMPROVE CHANNEL AND GATE OXIDE RELIABILITY

[75] Inventors: Fred N. Hause, Austin; Mark I. Gardner, Cedar Creek, both of Tex.

[73] Assignee: Advanced Micro Devices, Inc., Sunnyvale, Calif.

[21] Appl. No.: 822,122

[22] Filed: Mar. 21, 1997

[51] Int. Cl.[6] .................................................. H01L 21/336
[52] U.S. Cl. ........................ 438/308; 438/227; 438/301; 438/305; 438/308
[58] Field of Search .................................. 438/163, 227, 438/301, 305, 308, 407, 508, 515, 535, 585, 624, 766, 168, 169

[56] References Cited

U.S. PATENT DOCUMENTS

| | | | |
|---|---|---|---|
| 4,642,878 | 2/1987 | Maeda | 438/305 |
| 4,738,934 | 4/1988 | Johnston, Jr. et al. | 438/508 |
| 5,064,775 | 11/1991 | Chang | 438/163 |
| 5,284,795 | 2/1994 | Gay et al. | 438/535 |
| 5,420,056 | 5/1995 | Moslehi | 438/308 |
| 5,580,800 | 12/1996 | Zhang et al. | 438/585 |

*Primary Examiner*—Peter Toby Brown
*Assistant Examiner*—Khanh Duong
*Attorney, Agent, or Firm*—Conley, Rose & Tayon; Robert C. Kowert; Kevin L. Daffer

[57] ABSTRACT

An integrated circuit is formed with minimal encroachment of lightly doped drain (LDD) implants partially due to barrier atoms incorporated along the migration avenues. Nitrogen is incorporated either during the LDD implant or during an anneal cycle following the LDD implant. Nitrogen helps minimize segregation and diffusion of LDD dopants placed adjacent critical channel and gate dielectric areas. Nitrogen is incorporated within a chamber while under pressure so as to minimize the temperature needed to repair implant damage and activate the LDD dopants. High pressure indoctrination of nitrogen is believed to provide the same amount of lattice repair and activation achieved if anneal temperatures were substantially higher.

7 Claims, 3 Drawing Sheets

SEMICONDUCTOR FABRICATION EMPLOYING A POST-IMPLANT ANNEAL WITHIN A LOW TEMPERATURE HIGH PRESSURE NITROGEN AMBIENT TO IMPROVE CHANNEL AND GATE OXIDE RELIABILITY

BACKGROUND OF THE INVENTION

1. Field of the Invention

This invention relates to integrated circuit fabrication and, more particularly, to a transistor and a method of forming a transistor using pressurized nitrogen during a post implant anneal cycle to minimize migration of the implant species into critical areas.

2. Description of the Relevant Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal anneal ("RTA") chamber. A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

An n-channel transistor, or NMOS transistor, must in most instances be fabricated different from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions become less than the physical channel length and is often referred to as the effective channel length ("Leff"). In high density designs, not only does the physical channel length become small, so too must the Leff. As Leff decreases below approximately 1.0 $\mu$m for example, a problem known as short channel effects ("SCF") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors.

Unless modifications are made to the fabrication sequence, problems resulting from HCE will remain. To minimize these problems, a mechanism must be derived that disperses and thereby reduces Em. That mechanism is often referred to as the double-diffused drain ("DDD") and lightly doped drain ("LDD") techniques. The purpose behind using DDDs and LDDs structures is to absorb some of the potential into the drain and away from the drain/channel interface. The popularity of DDD structures has given way to LDD structures since DDD causes unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section within the junction at the gate edge, near the channel. The second implant dose within the junction is spaced from the channel a distance dictated by the thickness of the sidewall spacer. Resulting from the first and second implants, a dopant gradient occurs across the junction from the source/drain area of the junction to the LDD area adjacent the channel.

The LDD implant solves to some extent the HCE problem, but does so at a cost. Dispersion of Em requires that the LDD implant area be sufficiently large near the critical drain-side of the channel. Due to the symmetrical nature of the LDD implant, the large LDD implant area at the drain also occurs near the source-side of the channel. Thus, the LDD implant adds significant parasitic resistance and capacitance to the source-drain path of the ensuing transistor. The added resistance/capacitance is compounded to some extent by migrating LDD dopants during subsequent heat cycles. While heating is necessary to repair implant damage and activate the dopants within the crystalline lattice, heating unfortunately spreads the LDD area toward critical channel and overlying gate dielectric regions. Heating used to repair implant is often referred to as "anneal". Annealing the crystalline substrate is necessary post implant. Depending upon the amount of implant damage, the anneal temperature can vary. For example, small point defects, or clusters of irregularly arranged lattice areas can be re-oriented to their proper positions using a relatively low temperature anneal. However, if the localized defect areas become amorphized, or the amorphized region is continuous throughout the implant layer, then a much higher anneal temperature is needed. Typically, the anneal temperature needed to repair amorphized or heavy primary crystalline damage ranges between 850° C. to 1050° C.

As a byproduct to the anneal cycle, dopants within the LDD segregate and migrate in a vertical as well as horizontal direction. Diffusion causes enlargement of the LDD area, leading to enhanced parasitic problems. Further, diffusion of LDD dopants into the channel causes enhanced SCE problems. While it is necessary to anneal implant damage from the crystalline lattice, it would be desirable to do so with minimal migration of the implanted dopant. More specifically, a process must be derived which can carefully control implants placed close to critical areas—i.e., control of the LDD dopants placed closer to the channel than other implant areas is needed. Control implies placing limits on the diffusion length of the LDD dopants toward the critical areas. The improved process must be one which can minimize HCE and the problems of hot carriers injected from the drain-side LDD into the gate oxide.

SUMMARY OF THE INVENTION

The problems outlined above are in large part solved by an improved transistor configuration, and a method for forming the improved configuration. The present transistor can be either a PMOS or NMOS transistor, and accordingly, the present process is applicable to any MOS fabrication sequence, including a CMOS sequence.

The present transistor is classified as having a graded junction defined as a junction containing a lighter concentration, lower energy LDD implant placed adjacent the channel and heavier concentration, higher energy source/drain implant spaced from the channel. The LDD region is designed such that barrier atoms exists along migration avenues at a critical perimeter of the LDD area. The barrier atoms comprise nitrogen, oxygen, argon and/or hydrogen. Preferably, the barrier atoms comprise only nitrogen. The nitrogen exists as atoms at the critical juncture between the implanted LDD area and the channel which separates the LDD from another LDD. Nitrogen atoms serve to minimize migration or diffusion of the LDD dopants from their implanted position during anneal.

According to one embodiment, nitrogen is incorporated into the critical LDD areas concurrent with implanting the LDD dopants. According to an alternative embodiment, nitrogen is incorporated after LDD implant but concurrent with the anneal cycle. Regardless of the sequence by which nitrogen is incorporated, it is of benefit that the nitrogen be pressurized so that it extends to the horizontal and vertical perimeter of the LDD area. Importantly, pressurization is believed to "drive" the nitrogen atoms into the crystalline lattice and, particularly, near the channel/LDD interface. If nitrogenation occurs during anneal, pressurization helps minimize the amount of temperature needed to repair implant damage. Reduced temperature, however, is still sufficient to drive nitrogen into the channel/LDD interface.

Nitrogen is pressurized within a chamber used for implanting the LDD dopants or for annealing those dopants. The pressure level preferably exceeds atmosphere pressure. According to one embodiment, nitrogen within the nitrogen delivery chamber is pressurized above 3.0 atmospheres. Pressurizing nitrogen within either the ion implant chamber or the anneal chamber causes sufficient indoctrination of nitrogen at critical barrier sites so as to control distribution of LDD dopants during anneal. Typically, LDD dopants are of light dopant concentrations and therefore do not cause significant amorphizing of the crystalline lattice. A lower temperature anneal can be performed providing, however, the nitrogen barrier atoms are in place. It is postulated the higher pressure not only helps place nitrogen, but also may help redistribute the silicon atoms. The moving nitrogen atoms might carry, to a lesser extent, silicon atoms from an irregular bond site to a more normal site. It is believed the higher pressure offsets, to some degree, temperature—higher pressure correlates to lower temperature up to a point of diminishing return.

Pressurization appears to carry the barrier atoms not only to the channel/LDD interface, but also to the gate dielectric. The barrier atoms, e.g., nitrogen in the channel/LDD interface serve not only to prevent LDD encroachment, but also to prevent channel dopant out-diffusion. Nitrogen atoms in the gate dielectric minimize injection of hot carriers from the drain-side LDD to the gate dielectric. Nitrogen atoms within the paths of the migratory dopants and/or hot carriers serve to substantially block their passage. The result being a consistently formed transistor which demonstrates high reliability in the field.

Broadly speaking, the present invention contemplates a method for forming an integrated circuit. The integrated circuit comprises a plurality of transistors, including NMOS and/or PMOS transistors. The integrated circuit is formed by the steps of providing a semiconductor substrate having an active area adjacent a field area. A gate conductor is patterned a dielectric spaced distance over the active area. The dielectric spaced distance is a distance occupied by a gate dielectric. A dopant is then implanted at a first concentration into a portion of the active area that is absent the overlying gate conductor. The implanted portion of the active area is an LDD area comprising a relatively light, first concentration of the dopant. The dopant is then annealed within a chamber containing nitrogen gas. The chamber is both heated and pressurized to repair damage resulting from the implanting step while substantially maintaining a lateral demarcation within the active area between a region defined by the LDD dopant and another region (i.e., channel region) absent the dopant. According to one embodiment, the chamber containing nitrogen is pressurized above 3.0 atmospheres. According to another embodiment, the chamber is heated to a temperature less than 800° C. The lower anneal temperature of 800° C. will adequately anneal implant damage from the substrate providing, however, that pressurized nitrogen gas is delivered concurrent with the implant or anneal step.

The present invention further contemplates a transistor. The transistor comprises a gate conductor spaced by a gate dielectric over a channel. The channel comprises a portion of an active region within a semiconductor substrate. A first implant region is bounded within the active region laterally outside of the channel. A second implant region is bounded within the active region a spaced distance outside of the channel. A plurality of nitrogen atoms accumulate partially within a juncture between the first implant region and the channel as well as within a juncture between the channel and the gate conductor proximate to the first implant region. The plurality of nitrogen atoms preferably occupy avenues of migration of the first plurality of dopants into the channel. As such, the demarcation between the first implant region and the channel moves less than approximately 0.5 microns post-anneal as a result of migration avenues being occupied. Accordingly, nitrogen serves as a barrier to reduce LDD diffusion lengths as well as to reduce injection of hot carriers into the gate oxide near the drain-side of the channel.

BRIEF DESCRIPTION OF THE DRAWINGS

Other objects and advantages of the invention will become apparent upon reading the following detailed description and upon reference to the accompanying drawings in which.

Figure 1:
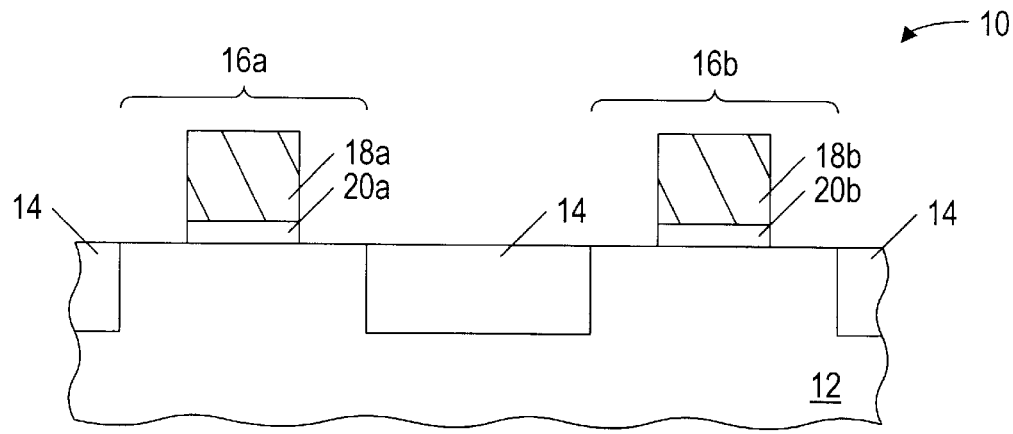
FIG. 1 is a cross-sectional view of a semiconductor topography having gate conductors dielectrically formed upon active areas between field dielectrics spaced upon or within a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial, cross-sectional view of a semiconductor topography 10. Topography 10 comprises a silicon-based substrate 12, preferably made of single crystalline silicon lattice. Substrate 12 includes numerous features formed upon and within the upper surface of topography 10. For example, field dielectrics 14 are formed at spaced distances across an upper surface of substrate 12. Field dielectric 14 exists only in field or "isolation" areas, between which active areas 16 exists. Active areas 16 encompass numerous active or passive devices and are connected with one another to form an integrated circuit. For sake of brevity and clarity in the drawings, the interconnect between devices is not presented herein. It is understood, however, that interconnect does exist over field dielectrics between devices in active areas to form an integrated circuit.

Existing within active areas 16, as shown in FIG. 1, are gate conductors 18. Gate conductors, as well as underlying gate dielectric 20, are formed by depositing a conductive (or to-be-rendered conductive) material across topography 10 and then patterning that material using well-known lithography techniques. A result of the lithography process is a gate conductor and an underlying gate dielectric self aligned to the gate conductor, wherein the combination of gate conductor 18 and gate dielectric 20 exist across only a portion of active area 16.

Figure 2:
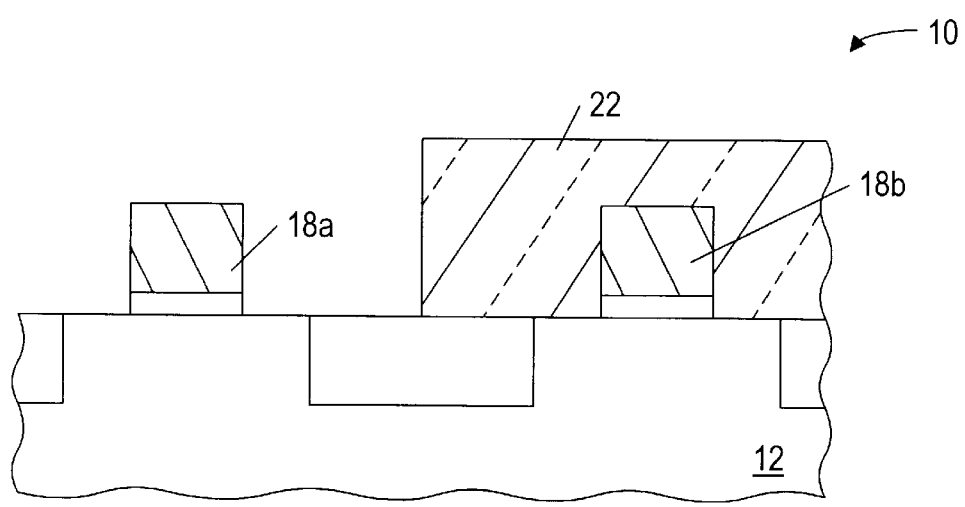
FIG. 2 is a cross-sectional view of the semiconductor topography, wherein a gate conductor and adjacent active area are selectively exposed in a process step subsequent to FIG. 1.

The portion of active area 16 not covered with gate conductor 18 will receive an implant. FIG. 2 depicts a masking layer 22 formed across select gate conductors 18b while leaving exposed other gate conductors 18a. Masking layer 22 is preferably made of a material which can be selectively polymerized. Accordingly, layer 22 comprises a photoresist material which, when selectively polymerized, allows non-polymerized material to be removed. The removed material leaves a portion of topography 10 exposed. That portion is preferably one that receives a specific type of implant. For example, the exposed topography 10 may receive an n-type implant. A reversal of the patterned masking layer 22 allows for p-type implants in active areas exclusive of the n-type implants.

Figure 3:
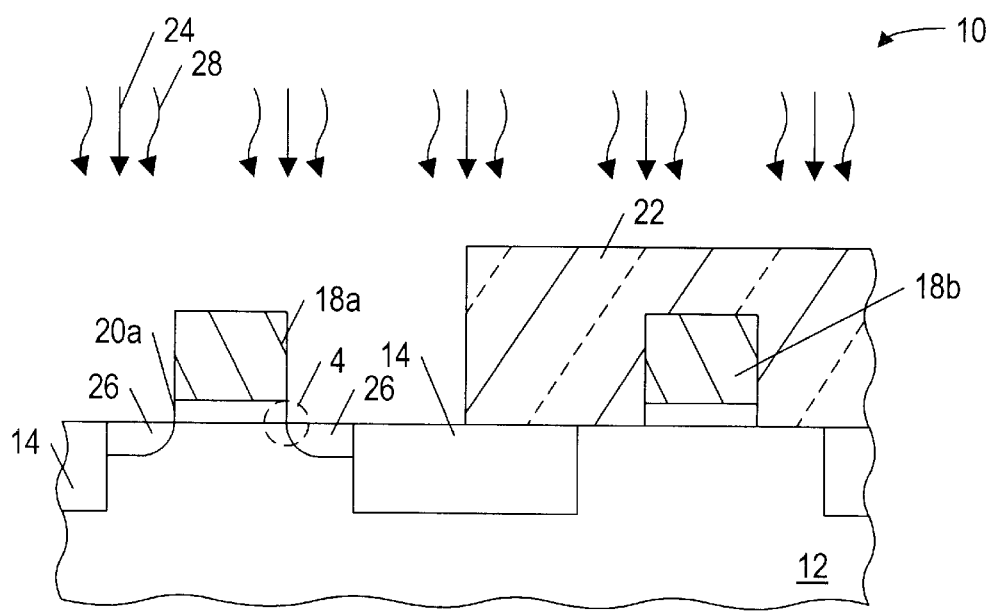
FIG. 3 is a cross-sectional view of the semiconductor topography, wherein the gate conductor and adjacent active area receive dopants of a first concentration prior to anneal in the presence of a pressurized barrier ambient.

FIG. 3 depicts a lightly doped drain (LDD) dopant forwarded into the exposed topography 10 at a first concentration density. The LDD implant, denoted as reference numeral 24, if forwarded nearly perpendicular to topography 10. Resulting from implant 24, LDD regions 26 occur within substrates 12. Regions 26 are self-aligned with lateral edges of gate conductor 18a and field regions 14 in accordance with the well-known self-aligned process.

Concurrent with, or subsequent to, implant 24, barrier atoms are incorporated into LDD regions 26. Barrier atoms comprise nitrogen, oxygen, nitrogen and oxygen, nitrogen and hydrogen, oxygen or argon, for example. Preferably, the barrier atoms comprise nitrogen atoms. Hereinafter, the barrier atoms are referred to as nitrogen atoms to denote inert barrier atoms in general. The nitrogen atoms derive from a gaseous species forwarded into the ion implant chamber in the first instance or, alternatively, nitrogen gas can be imparted into the thermal anneal chamber after implantation. Regardless of when nitrogen is introduced, the nitrogen atoms settle at bond opportunities within the implant-disrupted substrate 12 as well as non-stoichiometric portions of gate dielectric 20a.

FIG. 3 illustrates one of possibly two different process sequences. In the first instance, nitrogen is incorporated with ion implantation, followed by a conventional thermal anneal. According to a second scenario, nitrogen is incorporated during chamber being heated to effectuate simultaneous implant, nitridation and anneal. In the third instance, nitrogen is incorporated concurrent with anneal, subsequent to ion implantation. Regardless of the scenario, nitrogen is incorporated under elevated pressure conditions so as to drive the nitrogen atoms into the silicon lattice, and specifically, to critical regions of that silicon lattice. High pressure affords proper indoctrination of nitrogen at dopant diffusion and carrier injection avenues while avoiding elevating temperatures normally associated with conventional anneal cycles. Accordingly, FIG. 3 illustrates dual processing steps of implantation 24 and anneal 28, into which nitrogenation occurs concurrent with either one of those steps. Anneal is illustrated by thermal heat waves 28. It is understood that anneal occurs after photoresist 22 is removed. Anneal can occur concurrent with implant if implant is a blanket implant, without photoresist 22. In this instance, implant defines a single LDD implant type—i.e., not a CMOS sequence involving patterned photoresist. Thus, the present implantation 24, anneal 28 and nitrogenation can occur simultaneous with one another in a single, modified implant/anneal chamber if photoresist is not involved.

Figure 4A:
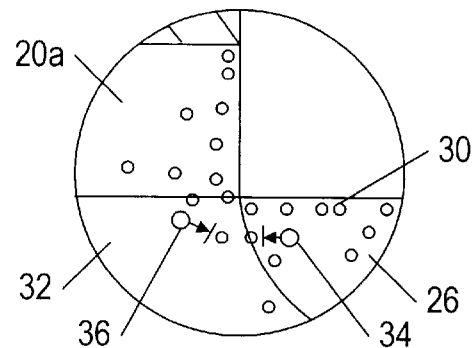
FIG. 4a is a detailed view along area 4 of FIG. 3, illustrating the effects of barrier atoms occupying diffusion avenue at the channel/LDD juncture.
Figure 4B:
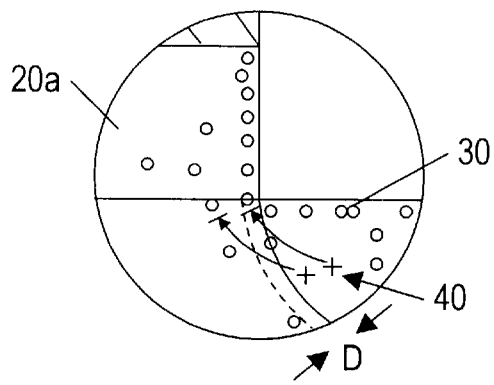
FIG. 4b is a detailed view along area 4 of FIG. 3, illustrating the effects of barrier atoms occupying hot carrier injection sites near the channel/gate dielectric juncture proximate to the drain-side of the channel.

FIGS. 4a and 4b provide detailed illustration of the relative location of nitrogen and the beneficial effect of nitrogen in those locations. More specifically, FIG. 4a illustrates a plurality of nitrogen atoms 30 existing at relatively high concentrations near the surface of LDD area 26, gate dielectric 20a and a portion of channel 32 immediately proximate to LDD 26 and gate dielectric 20a. The nitrogen atoms 30 acquire a bond position resulting from the LDD implant, but also occupy bond opportunities near the juncture between the LDD implant area 26 and channel 32. Those opportunities are postulated to occur primarily as dangling bonds which also exist at the juncture between channel 32 and gate dielectric 20a. The fulfilled bond areas allow nitrogen to occupy potential migration, diffusion, or injection avenues.

FIG. 4a illustrates nitrogen atoms occupying migration avenues normally resulting from thermal energy imparted to substrate 12. That thermal energy arises from an anneal cycle which would normally cause LDD implanted species 34 to migrate from LDD area 26 into channel 32. However, the presence of nitrogen serves as a barrier, to block the avenue of migration. Likewise, nitrogen atoms 30 block migration of a pre-existing channel implant species 36 from migrating from the periphery of channel 32 into LDD area 26. Resulting from nitrogen's affinity toward bonding at the migration avenues (i.e., at the juncture between LDD area 26 and channel 32) nitrogen serves to maintain demarcation between those areas. Nitrogen must be incorporated at relatively high pressures so as to ensure its placement in the critical areas. However, indoctrination of nitrogen helps occupy as well as rearrange lattice disruption so that a lower temperature anneal can be used to achieve the same effect as a higher temperature anneal. It is believed that high pressure indoctrination of nitrogen (e.g., at a pressure exceeding one atmosphere and preferably 3.0 atmospheres) allows anneal to occur less than 800° C. with the same effect as if it were to occur greater than approximately 900° C. without high pressure nitrogenation.

FIG. 4b illustrates an additional advantage of nitrogenation. Specifically, nitrogen serves to prevent charged, hot carriers 40 from being injected from the drain-side of LDD area 26 into trap sites within gate dielectric 20a. It is believed, therefore, that nitrogen atoms 30 occupy the injection avenues and possibly assimilate the charge being injected prior to it being trapped within gate oxide 20a. Accordingly, FIG. 4b illustrates the benefit of reducing HCE. This benefit is prevalent whenever the ensuing transistor is operating. Thus, it is believed nitrogen enhances the long-term reliability of an integrated circuit formed by the present process.

FIG. 4b indicates a distance D by which LDD area 26 encroaches into channel 32 post high pressure anneal. The presence of nitrogen atoms 30 during anneal helps ensure that distance D is less than 0.05 microns. Accordingly, the demarcation line at the channel/LDD juncture does not significantly move when subjected to a nitrogen-pressurized heat cycle. This is partially due to the lower temperature anneal afforded by the present process, and partially due to the presence of nitrogen at the migratory (diffusion) channels.

Figure 5:
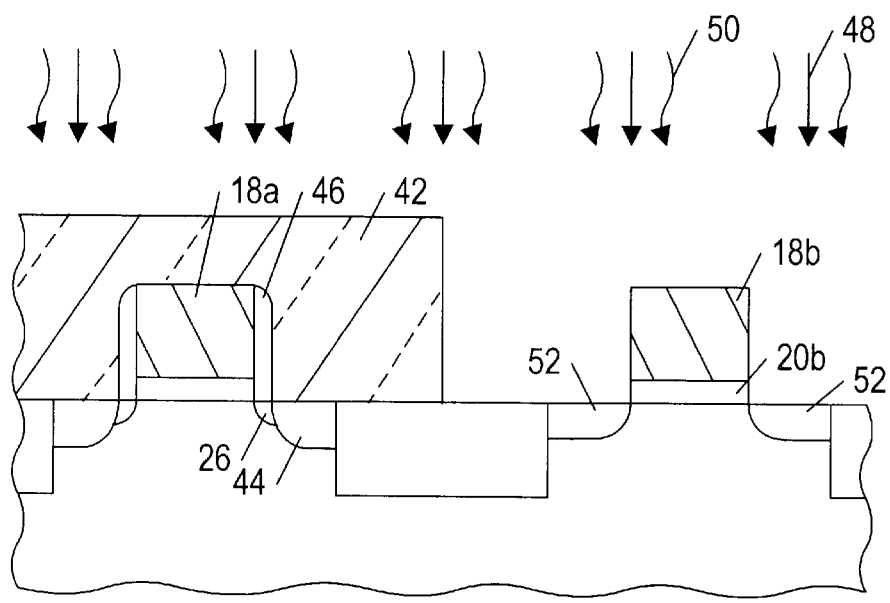
FIG. 5 is a cross-sectional view of the semiconductor topography, wherein the steps of FIGS. 2 and 3 are repeated for another gate conductor and associated active area implanted opposite the first gate conductor and associated active area.

FIG. 5 illustrates a subsequent processing step to that shown in FIG. 3. It is apparent that the processing sequence can be continued for numerous processing steps needed to achieve a CMOS integrated circuit. As such, FIG. 5 illustrates a masking layer 42 patterned opposite that of masking layer 22 (shown in FIG. 3). Masking layer 42 covers or masks the previously implanted active area associated with gate conductor 18a. FIG. 5 depicts processing steps which occur after a graded junction of LDD area 26 and source/drain area 44 are formed in the first active area 16a. Using the self-aligned process, source/drain regions 44 align with a sidewall spacer 46 patterned on opposing sidewall surfaces of gate conductor 18a. The combination of LDD area 26 and source/drain area 44 prove useful in minimizing HCE. Covering gate conductor 18a as well as the graded junction comprising region 26 and 44 by masking layer 42 allows the process sequence shown in FIG. 3 to be repeated in FIG. 5 but in an altogether different active area. Specifically, FIG. 5 illustrates LDD implant 48 concurrent with or prior to an anneal cycle 50. Along with implant 48 or anneal 50 is the incorporation of nitrogen, similar to the process sequence shown in FIG. 3. Accordingly, FIG. 5 is provided to show reference to an LDD implant 48 of a different implant type than LDD implant 24. Resulting from LDD implant 48 is an LDD area 52.

A difference in implant species from that shown in FIGS. 3 and 5 produces a CMOS integrated circuit, if desired. Alternatively, the implant species can be the same or, more specifically, the processing steps of FIG. 5 eliminated to produce a single type NMOS or PMOS integrated circuit.

Figure 6:
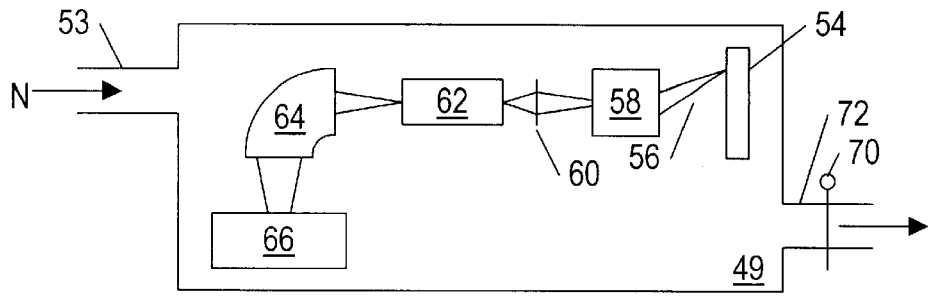
FIG. 6 is a plan diagram of an ion implanter retrofitted to accept pressurized barrier gas needed to perform in-situ implant or in-situ anneal.

FIG. 6 depicts an ion implant chamber 49 retrofitted to accept a pressurized ambient containing barrier atoms. Nitrogen is preferably forwarded through an input port 53 so that nitrogen gas exists at the position in which a semiconductor wafer 54 resides. Wafer 54 is one which bears a semiconductor topography across which an ion beam 56 is scanned. Ion beam 56 is scanned by activating X and Y axes scanner 58. Scanner 58 scans a focused ion beam emitted from a focusing lens 60. Focusing lens 60 receives ions accelerated through an acceleration tube 62. The acceleration tube receives ions of a particular species filtered from other ions as a result of an analyzing magnet 64. Accordingly, analyzing magnet 64 receives ions of possibly numerous species emitted from ion source 66, but which forwards only ions of a desired atomic weight, such as ions used for LDD implant. Those ions are suitably n-type phosphorous or arsenic atoms, or p-type boron or boron difluoride ions.

Ion implant chamber 49 differs from conventional ion implantation devices in at least two important aspects. First, chamber 49 can be retrofitted to accept a pressurized ambient. The ambient is pressurized above one atmosphere, and is preferably pressurized above 3.0 atmospheres. Secondly, the pressurized ambient is specifically chosen as a herein defined barrier-entrained ambient such as nitrogen. Contrary to conventional ion sources which occur either in a vacuum without any ambient present, or occur with non-pressurized argon, the present implantation device achieves the benefits of pressurization and nitrogenation to which conventional devices do not achieve. Incorporation of nitrogen, as opposed to numerous other inert species, proves beneficial in that nitrogen has an affinity for bonding at critical regions when pressurized. The pressure level is monitored and maintained via a valve 70 arranged on outlet port 72.

It is appreciated that the present methodology can be carried forth within a retrofitted furnace, anneal chamber, or possibly a retrofitted ion implant chamber. The retrofitted annealing device is one having an inlet port for receiving nitrogen and a valve at the outlet port for maintaining pressure within the anneal chamber. As such, the present anneal chamber maintains a nitrogen pressure above one atmosphere during the anneal cycle. It is important that pressurized nitrogen be used as opposed to other inert species. It is postulated that the lower atomic weight of nitrogen affords indoctrination into the critical areas more so than non-pressurized germanium, for example.

Figure 7:
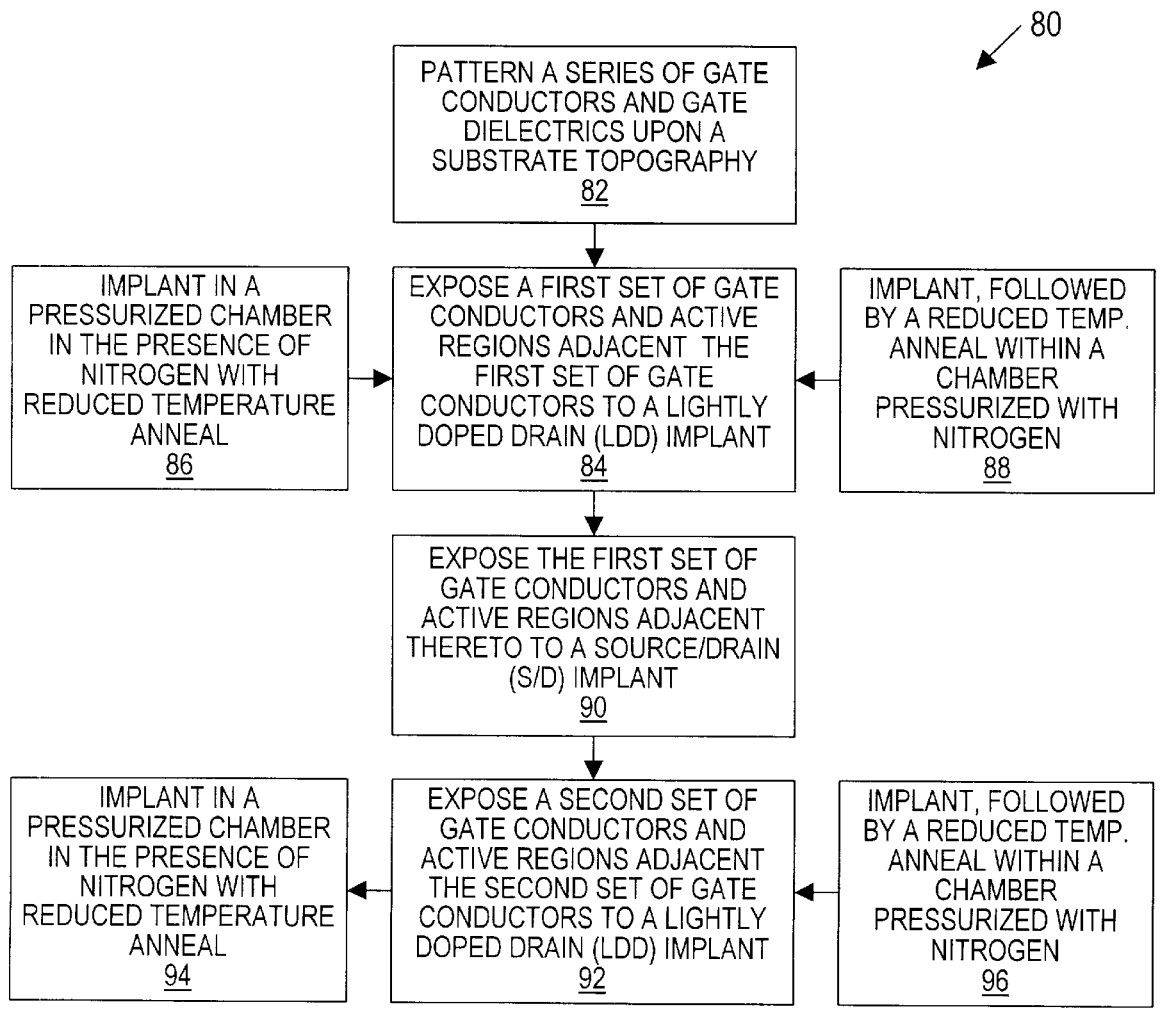
FIG. 7 is a flow diagram of steps used to pressurize a barrier gas, and to incorporate barrier atoms into critical juncture areas for achieving a reduced temperature anneal and controlling implant migration.

FIG. 7 depicts a processing sequence 80. Sequence 80 begins by forming a series of gate conductors and underlying gate dielectrics 82. Thereafter, a first set of gate conductors are exposed, allowing active regions adjacent thereto to receive an LDD implant 84. Implant occurs either within a pressurized chamber in the presence of nitrogen 86, or occurs in normal fashion followed by a pressurized anneal in the presence of nitrogen 88. In either instance, nitrogen is applied in a pressurized implant, diffusion or anneal chamber. In either instance, nitrogen is applied in a pressurized state so as to allow a lower temperature anneal (i.e., an anneal less than 800° C.).

Subsequent to forming the LDD implant area, the first set of gate conductors remains exposed to allow implant of a source/drain area within the junctions of the first gate conductors, as shown by reference numeral 90. The combination of LDD and source/drain implants complete the graded junction of the first set of gate conductors. If the entire integrated circuit comprises only a first set of gate conductors, then the process sequence can be terminated at this stage, merely followed with overlying interlevel dielectric, contact formation, metalization, etc. However, if a CMOS structure is to be formed, then the process sequence must continue by exposing a second set of gate conductors and active regions adjacent thereto, as shown by reference numeral 92. Similar to steps 86 and 88, the second set of gate conductors, and specifically, the implant regions adjacent the second set of gate conductors receive LDD implants. Concurrent with or subsequent to those implants is an anneal cycle performed at reduced temperature. The process steps used to implant and anneal the LDD areas are shown as reference numerals 92 through 96. Subsequent to the step shown by reference numeral 92, a source/drain implant can occur in the junctions spaced from the second set of gate conductors to complete the CMOS implant sequence.

It will be appreciated to those skilled in the art having the benefit of this disclosure that the invention is believed to be capable of forming MOS transistors which are less susceptible to dopant migration and HCE problems. It is to be understood that the form of the invention shown and described is to be taken as exemplary, presently preferred embodiments. Various modifications and changes may be made to each and every processing step without departing from the spirit and the scope of the invention, given the benefit of this disclosure as set forth in the claims. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
   providing a semiconductor substrate having an active area adjacent a field area defined by a field dielectric;
   patterning a gate conductor a dielectric spaced distance above the active area;
   implanting a dopant at a first concentration into a portion of the active area that is absent the overlying gate conductor to form a lightly doped drain region;
   annealing the substrate within a chamber containing nitrogen, said chamber is pressurized above 3.0 atmospheres;
   subsequent to said implanting a dopant at a first concentration and subsequent said annealing, implanting a dopant at a second concentration into the active area a spaced distance from a lateral edge of said gate conductor to form a drain region.

2. The method as recited in claim 1, wherein said annealing occurs concurrent with said implanting a dopant at a first concentration.

3. The method as recited in claim 1, wherein said annealing occurs subsequent to said implanting a dopant at a first concentration.

4. The method as recited in claim 1, wherein said first concentration is less than said second concentration.

5. The method as recited in claim 1, wherein, during said annealing, the chamber is maintained at a temperature less than 800° C.

6. The method as recited in claim 1, wherein a lateral demarcation of said lightly doped drain region remains, as a result of migration of nitrogen atoms, less than 0.05 microns inside a region of the active area directly below the gate conductor.

7. The method as recited in claim 1, wherein a lateral demarcation of said lightly doped drain region moves less than 0.05 microns as a result of migration of nitrogen atoms into the region defined by said lateral demarcation.

* * * * *